United States Patent [19]
Tang et al.

[11] Patent Number: 5,241,564
[45] Date of Patent: Aug. 31, 1993

[54] LOW NOISE, HIGH PERFORMANCE DATA BUS SYSTEM AND METHOD

[75] Inventors: Jeffrey Y. Tang, Los Altos; J. Leon Yang, Palo Alto, both of Calif.

[73] Assignee: Digital Equipment Corporation, Maynard, Mass.

[21] Appl. No.: 400,707

[22] Filed: Aug. 30, 1989

[51] Int. Cl.⁵ .................................... H03K 19/086
[52] U.S. Cl. .................................... 375/36; 375/76; 307/455; 307/467
[58] Field of Search ............... 307/465.1, 350, 356, 307/455, 466, 467; 375/7, 36, 76

[56] References Cited

U.S. PATENT DOCUMENTS

| | | | |
|---|---|---|---|
| 3,875,332 | 4/1975 | Fletcher et al. | 375/36 |
| 4,345,115 | 8/1982 | Sweet | 375/7 |
| 4,437,021 | 3/1984 | Sumi et al. | 375/36 |
| 4,495,626 | 1/1985 | Brunin et al. | 375/19 |
| 4,500,988 | 2/1985 | Bennett et al. | 375/36 |
| 4,516,245 | 5/1985 | Perry | 375/17 |
| 4,614,882 | 9/1986 | Parker et al. | 375/36 |
| 4,736,385 | 4/1988 | Pratt et al. | 375/36 |
| 4,847,867 | 7/1989 | Nasu et al. | 375/36 |
| 4,866,001 | 9/1989 | Pickett et al. | 357/59 |
| 4,885,795 | 12/1989 | Bunting et al. | 375/36 |
| 4,903,280 | 2/1990 | Lang et al. | 375/7 |
| 4,926,442 | 5/1990 | Bukowski et al. | 375/76 |

Primary Examiner—Curtis Kuntz
Assistant Examiner—Young Tse
Attorney, Agent, or Firm—Flehr, Hohbach, Test, Albritton, & Herbert

[57] ABSTRACT

Data bus system and method in which a plurality of data lines extend between functional units, and data signals having a predetermined voltage swing are sent from one unit to the others over the data lines. The sending unit also generates a reference voltage at the mid-point of the voltage swing, and this reference voltage is sent to the other units on a reference line for comparison with the signals on the data lines.

17 Claims, 2 Drawing Sheets

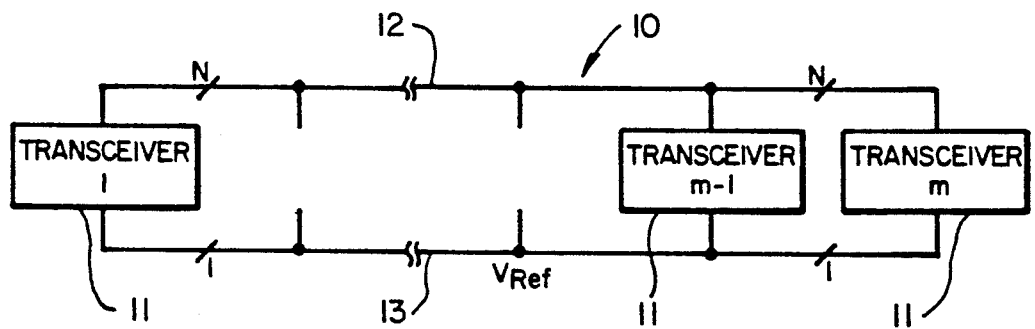
FIG_1
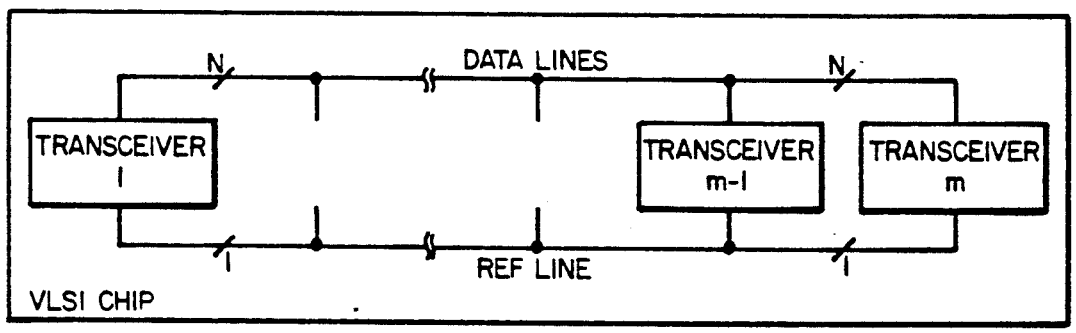
FIG_3
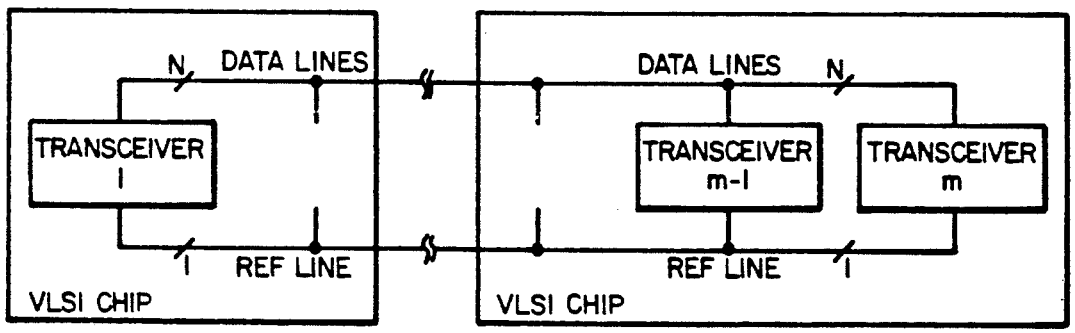
FIG_4

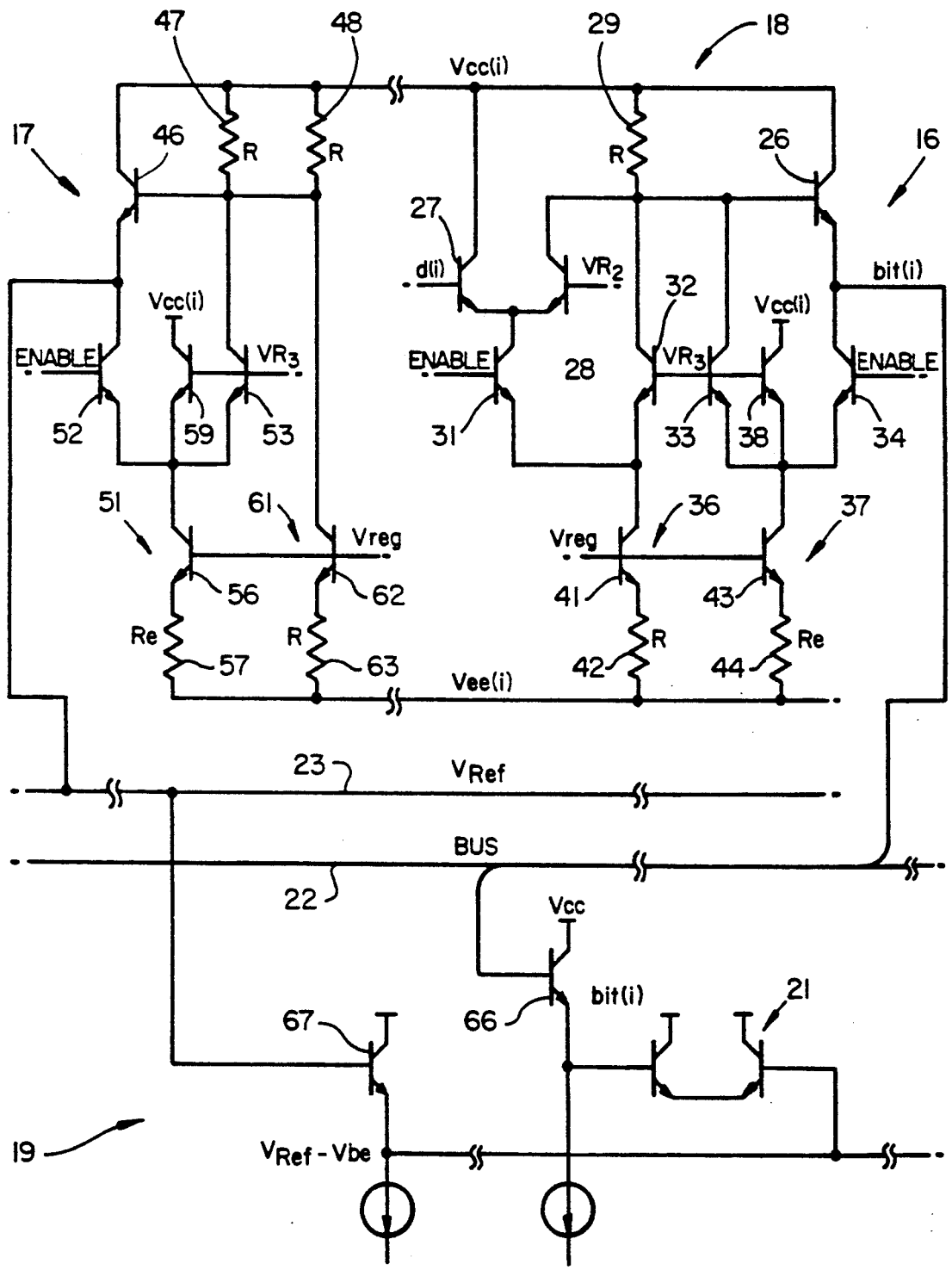
FIG_2

LOW NOISE, HIGH PERFORMANCE DATA BUS SYSTEM AND METHOD

This invention pertains generally to high speed digital computers and, more particularly, to a low noise, high performance data bus system and method.

Emitter coupled logic (ECL) circuits implemented with bipolar transistors generally have relatively low noise margins due to the low voltage logic swings employed therein. With temperature of 85° C. and a voltage swing of 600 mV, for example, a basic ECL gate has a noise margin of about 175 mV when driven in a single-ended manner. When the gate is driven differentially, the noise margin doubles, but so does the bus width, i.e., the number of lines in the bus.

In a LSI chip, approximately one-half of the noise budget is devoted to IR drops in the power distribution network, while the other half, which is mainly thermal voltage related, is devoted to fan-in noise, series gating noise, and $V_{be}$ mismatch noise.

In a VLSI environment, where chip sizes are larger and power dissipation is higher, the IR drops on the power distribution network increase at more than a linear rate while the basic noise margin stays the same. One brute force approach to accounting for the larger IR drops is to increase the logic swing and, hence, the noise margin at the expense of lower speed and higher AC power. Another approach has been to drive everything differentially, which doubles the noise margin and rejects common-mode noises such as IR drops. Unfortunately, it also doubles the width of the bus, making it more costly than a single-ended system and not practical for use in a densely populated environment such as a VLSI chip.

The invention provides a low noise, high performance bus system and method which require only one more line than a single-ended system but have the advantages of a differential system. A plurality of data lines extend between a plurality of functional units, and data signals having a predetermined voltage swing are sent from one unit to the others over the data lines. The sending unit also generates a reference voltage at the mid-point of the voltage swing, and this reference voltage is sent to the other units on a reference line for comparison with the signals on the data lines.

FIG. 1 is a partial block diagram of one embodiment of a digital computer system having a bus structure according to the invention.

FIG. 2 is a circuit diagram of a portion of one embodiment of an ECL implementation of the invention.

FIG. 3 is a block diagram similar to FIG. 1 of an embodiment in which the functional units, the data lines and the reference line are all on a single VLSI chip.

FIG. 4 is a block diagram of an embodiment in which some of the functional units are on different VLSI chips.

In FIG. 1, the invention is illustrated in connection with a digital computer system 10 in which a plurality of functional units or transceivers 11 are connected to a bus consisting of N data lines or signal lines 12 and a single reference line 13. The number of data lines is determined by the bit width of the system, and in a 64 bit system, for example, the bus would have 64 data lines, one for each bit.

Each of the functional units or transceivers has a driver for sending data signals to the other units via the data lines and a receiver for receiving the data signals sent by the other units. The protocol of the system is such that only one unit sends data at a time.

Each unit also includes means for generating a reference voltage which is applied to the reference line and distributed to the other units where it is utilized as a reference for the data signals received from the sending unit. Any differences in $V_{cc}$, $V_{ee}$, temperature or short range process variations between the sending unit and the receiving units thus become immaterial and are effectively rejected.

The invention can be utilized both in on-chip applications and in chip-to-chip, or off-chip, communications, and differences in $V_{cc}$, $V_{ee}$, temperature and short range process variations between the sending unit and the receiving units continue to be immaterial even when the bus spans more than the width of a chip.

Even with chip-to-chip applications, there is no need to increase voltage swing to increase noise margin, and in many applications, it is possible to reduce voltage swing and thereby improve speed. In a high speed system, a reduction of even a few per cent in bus delay can measurably improve the cycle time.

The invention can also be applied to chip-to-chip communications which currently rely on the voltage and temperature compensated 100K interface for ECL applications. In this case, the sending chip sends out its mid-point signal level as a reference to the receiving chips. The receiving of the data signals is thus made independent of voltage supply fluctuations, temperature differences, and process variations between the sending and receiving chips. The need for voltage and temperature compensation is eliminated, and the voltage swing between high and low logic levels can be reduced. With the elimination of compensation circuit overhead and the reduction in voltage swing, the speed of the interface is improved significantly.

An ECL implementation of the invention is illustrated in FIG. 2. This figure includes one of the data drivers 16 and the reference voltage generator 17 for one transceiver or functional unit 18, and a portion of the receiver 19 of another unit 21. Each of the units is connected to a data bus 22 and a reference bus 23, and each unit has a separate driver and a separate receiver for each data line in the bus. In the drawing, the driver and the receiver shown are indicated as being for bit(i), where i is a number between 0 and $N-1$.

The data driver includes an output transistor 26 which is configured as an emitter follower, with its emitter connected to the bus data line for bit(i) and its collector connected to $V_{cc}(i)$, the most positive voltage supply level for the sending unit.

Emitter follower 26 is driven by an ECL pair consisting of transistors 27, 28. The data d(i) for bit(i) is applied to the base of transistor 27, and, a voltage VR2 is applied to the base of transistor 28. The collector of transistor 26 is connected to Vcc(i), and the collector of transistor 28 is connected to the base of the emitter follower. A resistor 29 having a resistance R is connected between $V_{cc}(i)$ and the base of the emitter follower.

Current is steered to driver pair 27, 28 and to emitter follower 26 by differential pairs 31, 32 and 33, 34, respectively, from current sources 36, 37 under the control of an ENABLE signal. This signal is applied to the bases of transistors 31 and 34, and a voltage $VR_3$ is applied to the bases of transistors 32 and 33. An additional transistor 38 is connected in parallel with transistor 33, and has its collector connected to Vcc(i).

Current source 36 comprises a transistor 41 and a resistor 42 having a resistance R, and source 37 comprises a transistor 43 and a resistor 44 having a resistance $R_e$ which is smaller than resistance R. The levels of the currents produced by the sources are determined by resistors 42, 44 and by the level of the voltage $V_{reg}$ applied to the bases of the transistors. Strictly speaking, current sources 36, 37 are current sinks since the actual currents are produced by the difference in voltage level between $V_{cc}$ and $V_{ee}$, but since they cause the currents to flow at a particular level, they are commonly referred to as current sources.

The operation of the driver is as follows. When the ENABLE signal is asserted (high), current is supplied to the driver pair 27, 28 and to the emitter follower 26, and transistors 27, 28 are alternately turned on and off by the data signal applied to the base of transistor 27. When transistor 28 is turned off, no current flows in resistor 29, and the base of the emitter follower is at the positive source voltage $V_{cc}$. When transistor 28 is turned on, the current produced by source 36 flows through resistor 29, producing a voltage drop across the resistor. The voltage at the emitter of the emitter follower thus swings between high and low voltage levels VOH and VOL in accordance with the data to be sent, with the voltages VOH and VOL being given by the following relationships:

$$VOH = V_{cc}(i) - V_{be}$$

$$VOL = V_{cc}(i) - I_{36}R - V_{be}$$

where $V_{be}$ is the voltage drop between the base and the emitter of transistor 26. From these relationships, it will be noted that the swing in the output voltage (VOH-—VOL) is equal to the drop across resistor R.

When the ENABLE signal is removed (low), current is removed from driver pair 27, 28 and from emitter follower 26. In addition, the base-emitter junction of the emitter follower is reverse biased to make certain that the emitter follower is turned off. When the ENABLE signal is low, transistors 32, 33 and 38 are turned on, and current from sources 36 and 37 flows through resistor 29, producing a larger drop than the current from source 36 alone. This lowers the voltage at the base of the emitter follower to the point that the emitter follower is turned off and cannot e turned on by signals applied to the data bus by other units in the system. The current from source 37 is shared by transistor 33 and transistor 38, and since only the collector of transistor 33 is connected to the base of the emitter follower, only the portion of the shared current passing through that transistor affects level of the cut-off voltage applied to the emitter follower. Reducing the current in this manner prevents the cut-off voltage from being so low that it would impair the recovery of the emitter follower when the ENABLE signal is once again applied.

Reference voltage generator 17 has an output transistor 46 configured as an emitter follower, with its emitter connected to the reference line 23 and its collector connected to $V_{cc}(i)$. A pair of resistors 47, 48 each having a resistance R are connected between $V_{cc}(i)$ and the base of transistor 46.

Current is steered to emitter follower 46 from a current source 51 by a differential pair 52, 53. Source 51 is similar to source 37 and comprises a transistor 56 and a resistor 57 having a value $R_e$. An additional transistor 59 is connected in parallel with transistor 53, but with its collector connected to $V_{cc}(i)$ rather than to the base of the emitter follower. The ENABLE signal is applied to the base of transistor 52, and the voltage $VR_3$ is applied to the bases of transistors 53 and 59.

A second current source 61 is connected directly to the base of emitter follower 46. This source includes a transistor 62 and a resistor 63 with a resistance R.

When the ENABLE signal is applied (high), current is supplied to the emitter follower 46 by transistor 52, and a voltage drop is produced across resistors 47, 48 by the current produced by source 61. This produces a voltage $V_{Ref}$ at the emitter of the emitter follower in accordance with the following relationship:

$$V_{Ref} = V_{cc}(i) - I_{51}R/2 - V_{be}$$

where $I_{51}R/2$ is the voltage drop across resistors 47, 48 and $V_{be}$ is the base-emitter drop in transistor 46. Since the current from source 51 is equal to the current from source 36 and the base-emitter drop is the same in the two emitter followers, the drop across parallel resistors 47, 48 is exactly half the drop across resistor 29, and $V_{Ref}$ is at the mid-point of the output voltage swing of emitter follower 26.

When the ENABLE signal is low, transistor 52 is turned off, no current is supplied to emitter follower 46, and the reference voltage VRef is not applied to the reference line by this unit. The base-emitter junction of transistor 46 is reverse biased to hold this transistor in an off condition in the same manner that transistor 26 is reverse biased. Briefly, when the enable signal is low, transistors 53 and 59 are turned on, and additional current flows through resistors 47, 48 from source 51, increasing the drop across the resistors and lowering the voltage at the base of the emitter follower. The current from source 51 divides between transistors 53 and 59, preventing the voltage at the base of the emitter follower from dropping so low that as to delay the recovery of the emitter follower when the ENABLE signal is once again applied.

At the receiver 21, the data line 22 and the reference line 23 are connected to the bases of emitter followers 66, 67, respectively. These emitter followers buffer the data signals and the reference voltage and shift them down by one level to ensure that the current loading for the emitter followers for both the data signals and the reference voltage are similar so as to balance the ohmic drop on the metal lines. The voltage $V_{Ref} - V_{be}$ is then used as a reference for the data signals in the receiver.

As noted above, the invention overcomes the problems which have prevented differential bus systems of the prior art from being successfully employed in densely populated environments such as VLSI chips. FIG. 3 illustrates an embodiment in which the functional units, the data lines, and the reference line are all on a single VLSI chip, and FIG. 4 illustrates an embodiment in which some of the functional units are on different VLSI chips.

The invention has a number of important features and advantages. By using a distributed mid-point signal level as a reference voltage, a noise rejection similar to a differential bus is achieved with only N+1 lines for a bus of width N. Since only one additional line is required, the system requires little additional area, and it can be employed in VLSI applications and other applications where a differential bus cannot be used. The bus provides an interface which is superior to the ECL b 100K interface from the standpoint of both speed and noise rejection, and it eliminates the ned for voltage and temperature compensation in an ECL interface. The bus can be used for both on-chip and off-chip applications, and any temperature or voltage differences between sending and receiving units are immaterial. The effective noise rejection makes it possible to reduce the signal swing, resulting in higher speed switching operations. This reduces the cycle time of a machine and ensures stable operations on data and address busses on chips and on data and address busses between chips.

While only one ECL implementation of the invention has been described, the bus system and method can also be employed with other technologies such as CMOS, BICMOS and GaAs technologies.

It is apparent from the foregoing that a new and improved bus system and method have been provided. While only certain presently preferred embodiments have been described in detail, as will be apparent to those familiar with the art, certain changes and modifications can be made without departing from the scope of the invention a defined by the following claims.

We claim:

1. A bus system for carrying signals between a plurality of functional units in an ECL circuit: a plurality of data lines to which the units are connected, means at one of the units for sending a data signal of predetermined voltage swing over each one of the data lines to the other units, means at the one unit for generating a reference voltage at the mid-point of the voltage swing, and a reference line to which the units are connected for distributing the reference voltage to the other units.

2. The bus system of claim 1 wherein the functional units, the data lines and the reference line are all on a single chip.

3. The bus system of claim 1 wherein at least some of the functional units are on different chips.

4. A bus system for carrying signals between a plurality of functional units in a bipolar VLSI circuit; a plurality of data lines to which the units are connected, means at one of the units for sending a data signal of predetermined voltage swing over each of the data lines to the other units, a reference line to which the units are connected, and means at the one unit for applying a reference voltage of predetermined level relative to the voltage swing to the reference line for distribution to the other units.

5. The bus system of claim 4 wherein the functional units, the data lines and the reference line are all on a single VLSI chip.

6. The bus system of claim 4 wherein at least some of the functional units are on different VLSI chips.

7. A bus system for carrying signals between a plurality of functional units in an ECL circuit: a plurality of data lines to which the units are connected, a plurality of emitter followers at each of the units having their emitters connected to respective ones of the data lines for sending data signal to the other units, firs resistances connected to the bases of the emitter followers, means for switching current of predetermined level on and off through each of the resistances in accordance with the data to produce a voltage swing of predetermined magnitude across the resistances and at the bases of the emitter followers, a reference line to which the units are connected, an additional emitter follower at each of the units having its emitter connected to the reference line for applying a reference voltage to said reference line for distribution to the other units, a second resistance connected to the base of the additional emitter follower, and means responsive to an enabling signal for passing a current through the second resistance to produce a voltage at the base of the additional emitter follower which is at the mid-point of the voltage swing at the bases of the emitter followers connected to the data lines.

8. A method of transmitting signals on a plurality of data lines to which a plurality of functional units in an ECL circuit are connected, the steps of: sending data signals of predetermined voltage swing over the data lines from one of the units to the other units, generating at the one unit a reference voltage at the mid-point of the voltage swing of the data signals, and distributing the reference voltage to the other units on an additional line to which the units are connected.

9. A method of transmitting signals on a plurality of data lines to which a plurality of functional units in a bipolar VLSI circuit are connected, the steps of: sending a data signal of predetermined voltage swing over each of the plurality of data lines from one of the units to the other units, generating a reference voltage of predetermined level relative to the voltage swing at the one unit, and distributing the reference voltage to the other units over an additional line to which the units are connected.

10. A method of transmitting signals on data lines to which a plurality of functional units in an ECL circuit are connected, the steps of: connecting a plurality of emitter followers to respective ones of the data lines at one of the units for sending data signals to the other units, with the emitters of the emitter followers being connected to respective ones of the data lines, switching current of predetermined level on and of through first resistances in accordance with data to be transmitted to produce a voltage swing of predetermined magnitude across each of the first resistances, applying the voltage swing produced across each of the first resistances to the base of one of the emitter followers, connecting the units to a reference line with an additional emitter follower in each unit connected to the reference line for applying a reference voltage to the reference line for distribution to the other units, with the emitter of the additional emitter follower being connected to the reference line, connecting a second resistance to the base of the additional emitter follower, and passing a current through the second resistance to produce a voltage at the base of the additional emitter follower which is at the mid-point of the voltage swing at the bases of the emitter followers connected to the data lines.

11. The method of claim 10 including the step of reverse biasing the base-emitter junctions of the emitter followers when the unit is not sending data.

12. The method of claim 11 wherein the base-emitter junctions are reverse biased by passing currents through the first and second resistances to produce voltages at the base of the emitter followers which bias the emitter-followers to a state of nonconduction.

13. A bus system for carrying signals between a plurality of functional units in an ECL circuit: a plurality of data lines to which the units are connected, a plurality of emitter followers at one of the units having their emitters connected to respective ones of the data lines for sending data signals to the other units, a plurality of first resistances connected to the bases of respective ones of the emitter followers, means for switching current of predetermined level on and off through the first resistances in accordance with the data to produce a voltage swing of predetermined magnitude across the first resistances and at the bases of the emitter followers, a reference line to which the units are connected, an additional emitter follower having its emitter connected to the reference line at the one unit for applying a reference voltage to said reference line for distribution to the other units, a second resistance connected to the base of the additional emitter follower and having a value equal to one-half of the firs resistances, and means responsive to an enabling signal for passing a current of the predetermined level through the second resistance to produce a voltage at the base of the additional emitter follower which is at the mid-point of the voltage swing at the bases of the emitter followers connected to the data lines.

14. A bus system for carrying signals between a plurality of functional units in an ECL circuit: a plurality of data lines to which the units are connected, a plurality of emitter followers at one of the units having their emitters connected to respective ones of the data lines for sending data signals to the other units, a plurality of first resistances connected to the base of respective ones of the emitter followers, means for switching current of predetermined level on and off through the first resistances in accordance with the data to produce a voltage swing of predetermined magnitude across the first resistances and at the base of the emitter followers, a reference line to which the units are connected, an additional emitter follower at the one unit having its emitter connected to the reference line for applying a reference voltage to said reference line for distribution to the other units, a second resistance connected to the base of the additional emitter follower, means responsive to an enabling signal for passing a current through the second resistance to produce a voltage at the base of the additional emitter follower which is at the mid-point of the voltage swing at the bases of the emitter followers connected to the data lines, and means for reverse biasing the base-emitter junctions of the emitter followers in the absence of the enabling signal.

15. The bus system of claim 14 wherein the means for reverse biasing each of the base-emitter junctions includes a pair of transistors which are rendered conductive in the absence of the enabling signal, the collector of one of the transistors being connected to the base of the emitter followers, and a current source connected to the emitters of the transistors for producing a current which is divided between the transistors, with the current in the one transistor passing through the second resistance to produce a voltage at the base of the emitter followers which holds the emitter follower in a nonconductive condition.

16. A bus system for carrying signals between a plurality of functional units in a digital computer system: a plurality of data lines to which the units are connected, means at one of the units for sending data signals over the data lines to the other units, a reference line to which the units are connected, and means at the one unit for applying a reference voltage to the reference line for distribution to the other units.

17. A method of transmitting signals on a plurality of data lines to which a plurality of functional units in a digital computer system are connected, the steps of: sending data signals over the data lines from one of the units to the other units, generating a reference voltage at the one unit, and distributing the reference voltage to the other units on an additional line to which the units are connected.

* * * * *

UNITED STATES PATENT AND TRADEMARK OFFICE
CERTIFICATE OF CORRECTION

PATENT NO. : 5,241,564
DATED : August 31, 1993
INVENTOR(S) : Jeffrey Y. Tang et al.

It is certified that error appears in the above-identified patent and that said Letters Patent is hereby corrected as shown below:

Column 5,
Line 57, delete "firs" and insert therefor -- first --

Column 6,
Line 33, delete "second occurrence of "of"" and insert therefor -- off --

Column 7,
Line 8, delete "firs" and insert therefor -- first --.

Signed and Sealed this

Twenty-first Day of June, 2005

JON W. DUDAS
*Director of the United States Patent and Trademark Office*